United States Patent
Jesmanowicz et al.

(10) Patent No.: US 6,294,972 B1
(45) Date of Patent: Sep. 25, 2001

(54) METHOD FOR SHIMMING A STATIC MAGNETIC FIELD IN A LOCAL MRI COIL

(75) Inventors: Andrzej Jesmanowicz, Wauwatosa; James S. Hyde, Dousman, both of WI (US); William F. B. Punchard, Sudburry; Piotr M. Starewicz, Somerville, both of MA (US)

(73) Assignee: The MCW Research Foundation, Inc., Milwaukee, WI (US)

( * ) Notice: Subject to any disclaimer, the term of this patent is extended or adjusted under 35 U.S.C. 154(b) by 0 days.

(21) Appl. No.: 09/716,779

(22) Filed: Nov. 20, 2000

Related U.S. Application Data
(60) Provisional application No. 60/222,870, filed on Aug. 3, 2000.

(51) Int. Cl.[7] .............................. G01V 3/00; G01V 3/14; G01R 33/20
(52) U.S. Cl. ........................ 335/301; 324/318; 324/320
(58) Field of Search .................................... 335/216, 299, 335/301; 324/309, 318, 319, 320

(56) References Cited

U.S. PATENT DOCUMENTS

| | | | |
|---|---|---|---|
| 4,862,087 | 8/1989 | Hillenbrand et al. | 324/420 |
| 4,949,043 | 8/1990 | Hillenbrand et al. | 324/320 |
| 4,949,044 | 8/1990 | Starewicz et al. | 324/320 |
| 5,136,243 | 8/1992 | Starewicz et al. | 324/318 |
| 5,173,661 * | 12/1992 | Knuttel et al. | 324/309 |
| 5,313,164 | 5/1994 | Starewicz et al. | 324/318 |
| 5,349,297 | 9/1994 | De Meester et al. | 324/318 |
| 5,373,239 | 12/1994 | Marek et al. | 324/320 |
| 5,463,364 | 10/1995 | Muller | 335/299 |
| 5,490,509 | 2/1996 | Carlson et al. | 128/653.2 |
| 5,532,597 | 7/1996 | McGinley et al. | 324/319 |
| 5,650,724 * | 7/1997 | Yamagata | 324/320 |
| 5,677,854 | 10/1997 | Dorri | 364/578 |
| 6,023,167 * | 2/2000 | DeMeester et al. | 324/318 |

OTHER PUBLICATIONS

Real–Time Shimming Using a Trigger Grid at 3 Tesla, SMR 1994, Jesmanowicz, et al.
Real–Time Two–Shot EPI Auto Shim Overall Shiming Polynomials, SMR 1995, Jesmanowicz, et al.
Why Should Shim Coils be Orthogonal, Proc. SMR, 3,313 1995, E.C.Wong.
Dynamic Shim Updating: A New Approach Towards Optimized Whole Brain Shimming, MRM 36:158–165 1996, Balmire, et al.
Single–Pass Automatic 3D Shimming, ISMRM 1997, Jesmanowicz, et al.
Design of Dedicated Shim Fields, Proc. Intl. Soc. Magn. Reson. Med. 7 1999, Adalsteinsson, et al.

* cited by examiner

Primary Examiner—Ramon M. Barrera
(74) Attorney, Agent, or Firm—Quarles & Brady, LLP

(57) ABSTRACT

A local head coil for an MRI system includes a passive shim assembly having ferroshims placed to reduce $B_0$ field inhomogeneities caused by susceptibility effects in the subject being imaged. A prescan is performed with the subject in place to measure $B_0$ field inhomogeneities and the passive shim assembly is tailored to the subject by attaching ferroshim inserts based on these measurements.

10 Claims, 8 Drawing Sheets

METHOD FOR SHIMMING A STATIC MAGNETIC FIELD IN A LOCAL MRI COIL

RELATED APPLICATIONS

This application claims benefit of provisional application Ser. No. 60/222,870 filed on Aug. 3, 2000.

BACKGROUND OF THE INVENTION

The field of the invention is nuclear magnetic resonance imaging methods and systems. More particularly, the invention relates to a local coil for acquiring NMR images of a selected part of a subject such as the human brain.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

The Larmor frequency of the NMR signals is determined by the magnitude of the polarizing magnetic field $B_0$ and one of the design objectives of an MRI system is that it produce a homogeneous polarizing magnetic field throughout a volume of a specified size (e.g., a 50 cm sphere). To this end it is well known in the art to use shims which alter the magnetic field in order to make it homogenous. Such shimming may be accomplished actively by using shim coils which conduct the appropriate current are described in U.S. Pat. Nos. 4,949,043; 4,862,087 and 5,490,509. In the alternative, shimming may be accomplished passively by judiciously placing carbon steel shims at locations within the polarizing magnetic field as described in U.S. Pat. Nos. 5,677,854; 5,532,597 and 5,349,297. Such shimming is performed as part of the system calibration procedure and it is performed without a subject in the bore of the magnet.

It is well known in the art that the SNR of images produced by MRI systems can be increased by using small RF coils which are designed to couple solely with the tissues in the particular region of interest. Such "local" or "surface" coils have been designed for various parts of the human anatomy, such as knees, shoulders, neck, breasts, hands and head. Of particular relevance to the present invention are local head coils which employ the so-called "bird cage" RF coil described by C. E. Hayes et al, *J. Magn. Reson.* 63, 622–628 (1985) and U.S. Pat. No. 5,372,137.

The concept of acquiring NMR image data in a short time period has been known since 1977 when the echo-planar pulse sequence was produced by Peter Mansfield (J. Phys. C.10:L55–L58, 1977). In contrast to standard pulse sequences, the echo-planar pulse sequence produces a set of NMR signals for each RF excitation pulse. These NMR signals can be separately phase encoded so that an entire scan of 32, 64 or 128 views can be acquired in a single pulse sequence of 20 to 100 mili-seconds in duration. The advantages of echo-planar imaging ("EPI") are well-known, and there has been a long felt need for apparatus and methods which will enable EPI to be practiced in a clinical setting. Other echo-planar pulse sequences are disclosed in U.S. Pat. Nos. 4,678,996; 4,733,188; 4,176,369; 4,355,282; 4,588,948 and 4,752,735.

Functional magnetic resonance imaging (fMRI) is a method to map human brain function. See for example, U.S. Pat. No. 5,603,322. This method is dependent on the fact that highly localized changes in blood flow, blood volume and blood oxygenation occur that are a consequence of brain neuronal activity. The method of blood oxygen level dependent (BOLD) imaging has been found to be particularly effective in fMRI. Gradient-recalled (GR) rather than spin echo (SE) recalled pulse sequences are required for optimum sensitivity to BOLD contrast. As a result, the majority of fMRI studies to date have been performed using GR EPI.

The images acquired with EPI pulse sequences are very sensitive to local $B_0$ field inhomogeneities that arise from susceptibility differences between bone, tissue and air when a subject is placed in the otherwise homogeneous $B_0$ field. At high fields such as 3 Tesla where functional MRI is practiced, a 1 ppm deviation in $B_0$ magnetic field strength translates to a misplacement of 5 pixels in the phase encoding direction. It has become apparent, therefore, that further shimming must be performed after the subject to be imaged is placed in the MRI system.

One solution to this problem is to provide active shim coils that are located close to the subject as described in U.S. Pat. No. 6,023,167. The shim coils are integral with the local RF coil and a procedure is conducted after the subject is in place to determine the amount of current to apply to each shim coil to offset $B_0$ field inhomogeneities. This solution requires many shim coils, each with a separate power supply. This is not only expensive, but the wiring needed to couple the shim coils to the remotely located power supplies is very cumbersome.

SUMMARY OF THE INVENTION

The present invention relates to a local coil assembly for acquiring NMR signals from a region of interest in a subject, and particularly to the production of passive shims for such a coil assembly. The local coil assembly is used to acquire measurement signals with the subject in place, and these signals are used to reconstruct a map which indicates changes in the polarizing magnetic field ($\Delta B_0$) at locations throughout the region of interest, a ferroshim insert matrix is calculated from the $\Delta B_0$ map, a passive shim assembly is constructed with ferroshims placed at locations indicated by the ferroshim insert matrix; and the passive shim assembly is inserted into the local coil assembly to improve the homogeneity of the static polarizing field.

A general object of the invention is to compensate the polarizing magnetic field for inhomogeneities in the region of interest caused by the subject being imaged. A passive shim assembly is produced by acquiring measurements with the subject in place and producing a passive shim from information derived from these measurements. The passive shim customizes the local coil for the subject's particular anatomy.

Another object of the invention is to produce a set of local coils which are shimmed to offset variations in static magnetic field strength caused by common anatomic characteristics of subjects. Local coils with passive shim assemblies designed to compensate for different anatomical characteristics (e.g., short neck in head imaging) are produced. These local coils may be used as is with subjects having the corresponding anatomic characteristic, or they can be further customized to the subject by acquiring measurements and calculating further shim information. The further shim information may be used to alter the passive shim assembly, or it may be used to determine the currents in active shim coils.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
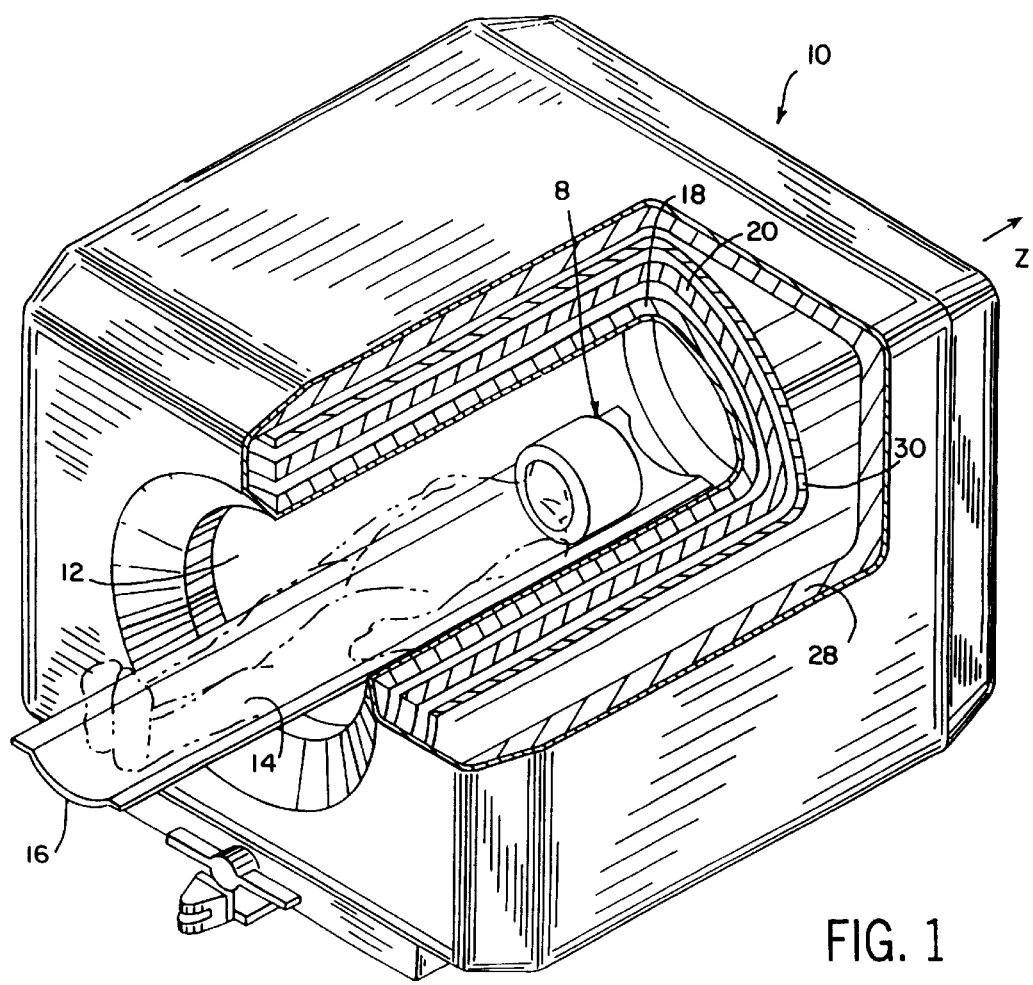
FIG. 1 is a perspective view with parts cut away of an NMR system which employs the present invention.

Referring to FIG. 1, an MRI magnet assembly 10 has a cylindrical bore tube 12 extending along a z-axis 13 for receiving a supine patient 14 supported on a table 16. The table 16 may move in and out of the bore tube 12 so as to position the patient 14 along the z-axis 13 within the volume of the bore tube 12.

Coaxially surrounding the bore tube 12 is a whole-body RF coil 18 for exciting the spins of the patient 14 into resonance, as has been described. Whole-body gradient coils 20 surround both the bore tube 12 and the RF coil 18 and are also coaxial with the z-axis 13, to provide x, y and z gradient fields $G_x$, $G_y$ and $G_z$ as required for MRI imaging. The gradient coils 20 are driven by gradient amplifiers (not shown). The polarizing magnetic field $B_0$, aligned with the z-axis 13 is generated by a superconducting magnet coil 28 coaxial with but outside the bore tube 12, the RF coil 18 and the gradient coils 20. The superconducting magnet coil 28 has no external power supply but operates on an initial current which continues unabated in the zero resistivity windings of the superconducting magnet coil 28.

Interposed between the superconducting magnet coil 28 and the gradient coil 20 is a set of shim coils 30 which are used to correct the homogeneity of the polarizing field $B_0$ as is understood in the art. A set of mechanical linkages and insulators (not shown) rigidly connect each of these coils 18, 20, 28 and 30 together to the bore tube 12 so as to resist relative motions generated by the interaction of their various electromagnetic fields.

When the local coil assembly 8 is used in a general purpose system such as that described above, the whole-body gradient coils 20 and whole-body RF coil 18 are disconnected. The local coil assembly is connected to the x, y and z gradient amplifiers (not shown) on the NMR system and it is connected to the system's transceiver through a transmit/receive switch. The preferred embodiment of the local coil assembly 8 is designed for use on a 3 Tesla MRI system manufactured by Bruker Analytische MeBtechnik GmbH and sold under the trademark BIOSPEC 30/60. It can be appreciated that the local coil assembly 8 may also be used with other MRI systems and magnet assemblies specifically designed for head imaging. Such head imaging magnet assemblies may have higher field strengths, but they need not be as large in physical size.

The local coil assembly 8, of the present invention, has a circular cylindrical shape and is sized to be received within the bore tube 12 when mounted on the table 16. The inside diameter of the bore tube 12 is approximately 22 inches whereas the inside of the local coil assembly 8 is elliptical in shape and sized to fit closely around the cranium of the subject 14. Thus, the internal volume of the local coil assembly 8 more nearly approaches the volume of the patient's brain.

Figure 2:
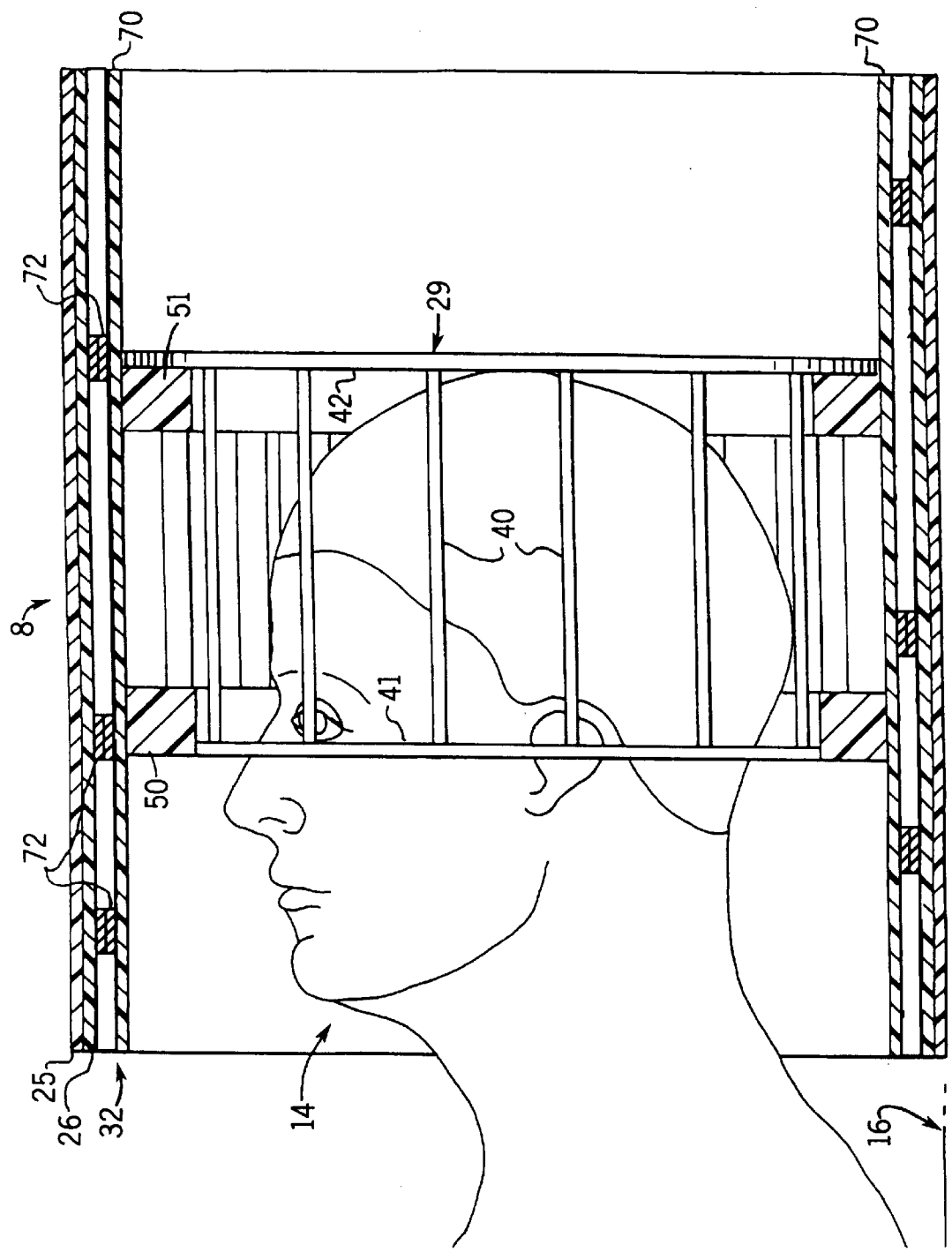
FIG. 2 is a partial elevation view with parts cut away of the subject positioned in the local coil which employs the present invention.
Figure 3:
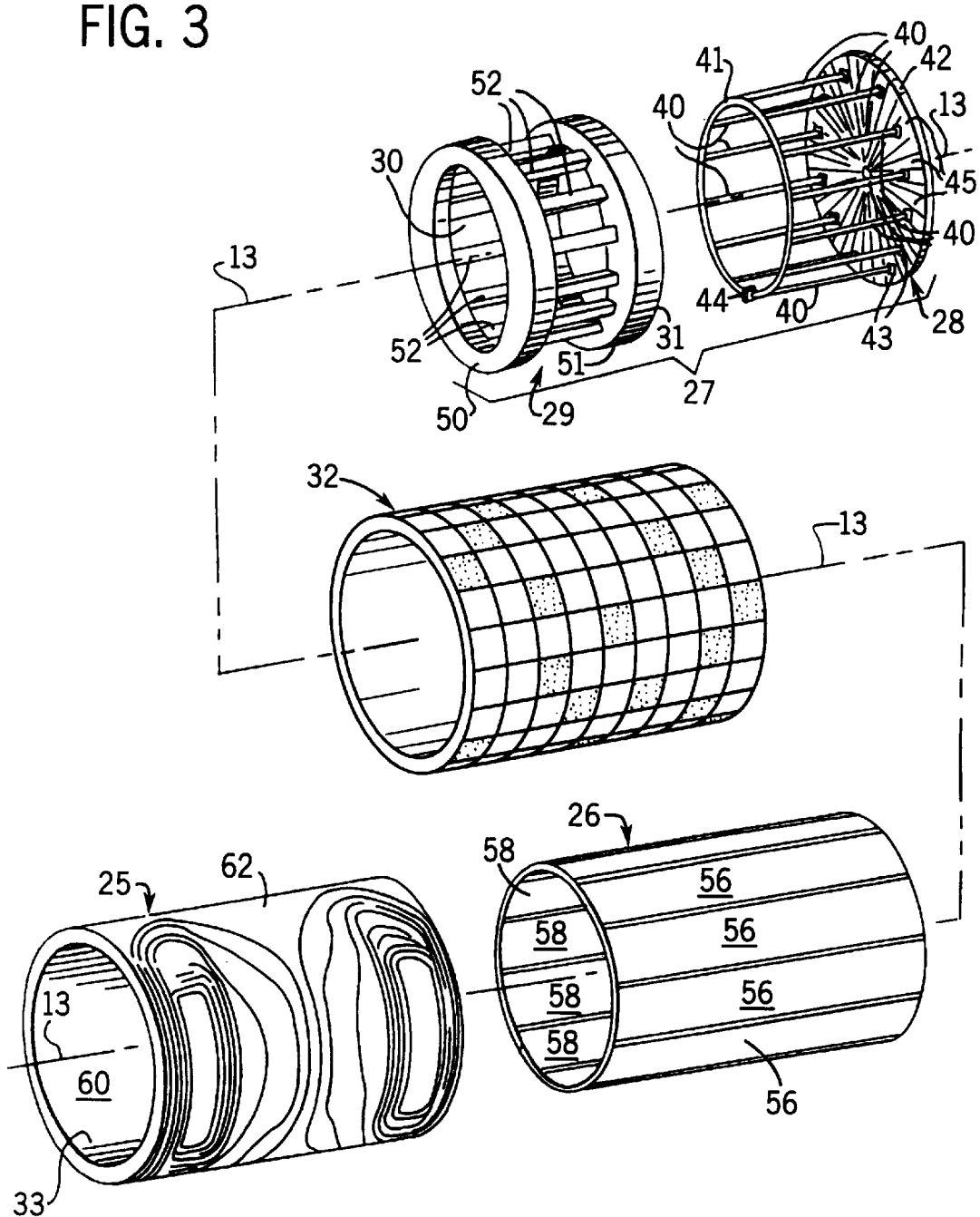
FIG. 3 is an exploded perspective view of the local coil of FIG. 2.

Referring particularly to FIGS. 2 and 3, the local coil assembly 8 is comprised of four modular assemblies: a gradient coil assembly 25; a shield assembly 26; a shim assembly 32; and an RF coil assembly 27. The RF coil assembly 27 is comprised of an end capped, bird cage coil 28 which is supported within a molded plastic support structure 29. The inner opening 30 in the support structure 29 is elliptical in shape to fit snugly around the patient's cranium, whereas its outer surface 31 is circular in shape and fits snugly within the circular opening in the shim assembly 32. The shim assembly 32 fits within the circular opening in the shield assembly 26, and the shield assembly 26 in turn fits snugly within the circular opening 33 in the gradient coil assembly 25.

Referring still to FIGS. 2 and 3, the bird cage coil 28 is comprised of a set of sixteen linear elements 40 joined at one end by a conductive end ring 41 and joined at the other end by a conductive end cap 42. The linear elements 40 are 15.9 cm in length and are disposed parallel to each other in an elliptical shape having a major axis of 22.9 cm and a minor axis of 19.1 cm. Coil 28 is a 12 element low-pass transmit-receive design, driven symmetrically through capacitive coupling as will be described below. Capacitors 43 at the junction of each linear element 40 and the end cap 42 tune the coil 28 to the Larmor frequency, and a capacitor 44 open circuits the end ring 41 at low frequencies. The end cap 42 is circular with a 29.5 cm diameter, and it is broken into wedge-shaped conductive segments 45 which are coupled together by capacitors 90. This capacitive coupling, as well as the capacitor 44 in the end ring 41, are essentially open circuits at the relatively low frequency of the gradient field pulses, and essentially short circuit at the much higher Larmor frequency of the RF coil 28. Eddy currents induced by the gradient fields are thus minimized by open circuiting all conductive loops in the coil 28 at the relatively low gradient field frequencies.

As shown in FIG. 3, the RF shield assembly 26 is comprised of a circular cylindrical substrate 55 which supports copper foil on both of its surfaces. The outer surface is covered with copper foil segments 56 that are separated by axially directed gaps and the inner surface is covered with copper foil segments 58 that are separated by axially directed gaps. The gaps are staggered such that the copper foil segments 56 and 58 overlap to form a continuous RF shield that surrounds the RF coil assembly 27. The substrate 55 is a dielectric material such as Mylar or Teflon that provides approximately 30 picofarads of capacitive coupling between the foil segments 56 and 58 on its opposite surfaces. This Capacitance provides a very low impedance at the relatively high Larmor frequency of the RF coil assembly 27, while presenting a very high impedance at the much lower gradient field pulse rates. Eddy currents induced by the gradient fields are thus minimized by breaking the shield 26 into separate segments, but these segments operate effectively as a continuous RF shield at the Larmor frequency. As shown best in FIG. 2, the RF coil 28 is positioned in the center of this shield 26.

Referring particularly to FIG. 3, the gradient coil assembly 25 is a circular cylindrical structure comprised of three coil layers. Each coil layer includes an insulating substrate which supports one of the three respective gradient field coils. More specifically, inner coil layer 60 supports the z-axis gradient coil, the middle coil layer supports the x-axis gradient coil and outer coil layer 62 supports the y-axis gradient coil.

For a more detailed description of the RF coil assembly 27, the shield assembly 26 and gradient coil assembly 25, reference is made to U.S. Pat. No. 5,372,137 entitled "NMR Local Coil For Brain Imaging" which is incorporated herein by reference.

Figure 4:
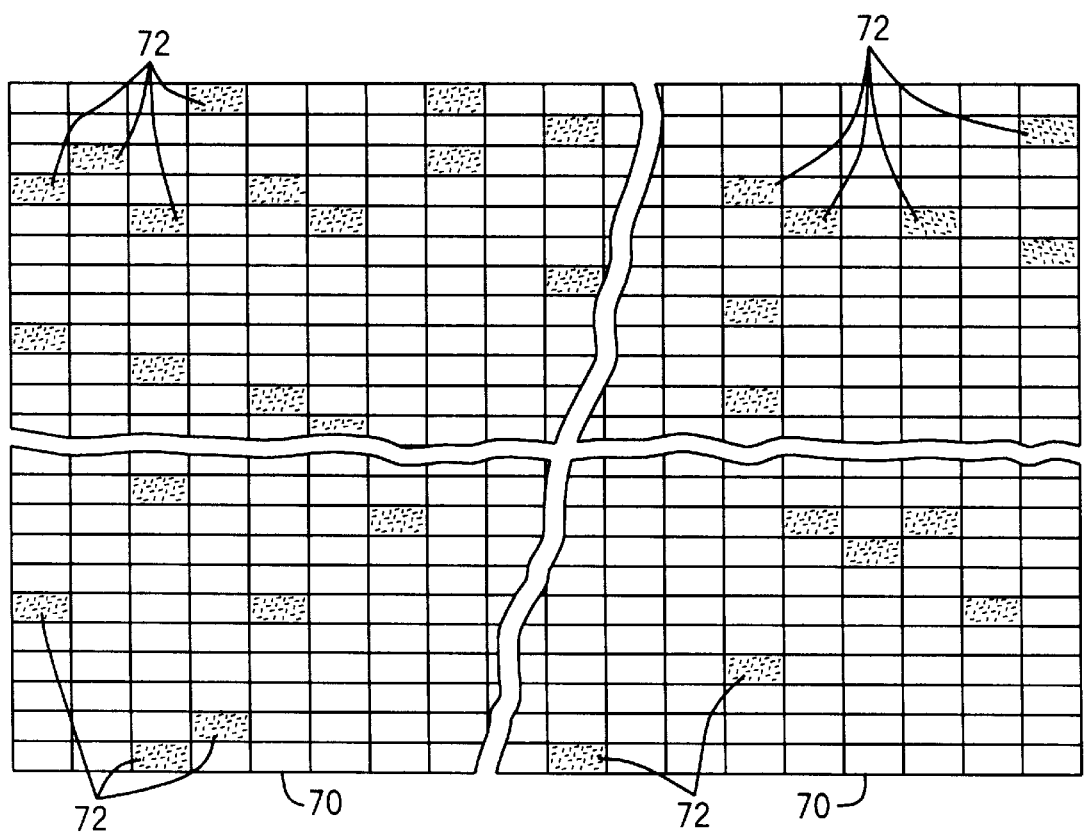
FIG. 4 is a plan view of the passive shim assembly prior to insertion into the local coil of FIGS. 2 and 3.

Referring particularly to FIGS. 3 and 4, the shim assembly 32 is a substantially circular cylindrical structure which wraps around the outer surface of the RF coil assembly 27. It is constructed of a rectangular sheet of Mylar foil 70 having a thickness of 0.125 mm. A 30×24 element matrix is defined on the surface of the foil 70, with each element in this matrix serving as a potential location for ferroshim inserts 72. The ferroshim inserts 72 are comprised of nickel foil pieces having thicknesses of 0.025 and 0.1 mm. As will be described in more detail below, the output of a susceptibility measurement process indicates the shim density on the cylindrical surface of the foil 70 when it is wrapped around the RF coil assembly 27, and this shim density map is translated to ferroshim insert thickness at each element in the 30×24 matrix. The required ferroshim inserts 72 may be bonded into place at the indicated locations and thicknesses in the matrix.

In the alternative, a second Mylar foil (not shown) may be fastened to the foil 70 and cut to form a pocket at each matrix element location. The indicated ferroshim inserts 72 are inserted into these pockets. The advantage of this alternative embodiment is that the shim assembly 32 may be reused many times on different subjects, by removing the ferroshim inserts 72 from the pockets and reusing the foil 70.

Concerning the choice of ferroshim material, it should be noted that any material with sufficiently high magnetization will work. However, preferred materials are those whose properties are well defined and which become magnetically saturated at fields well below the operating field of the MRI system polarizing magnet into which the ferroshim array is to be inserted. Thus pure iron or pure nickel will give better results than carbon steel, for example.

To practice the present invention the susceptibility effects produced by the subject being imaged are first measured by performing a measurement scan in which no ferroshim inserts 72 are attached to the shim assembly 32. The susceptibility measurements are processed as described below to indicate the location and thickness of ferroshim inserts 72 in the 30×24 matrix on the foil 70. The final shim assembly 32 is constructed by attaching the indicated ferroshim inserts 72 and then re-assembling the local coil assembly 8 with the final shim assembly 32 in place. To facilitate this process, the local coil assembly 8 is constructed such that the RF coil assembly 27 and surrounding shim assembly 32 may be easily removed from and reinserted into the local coil assembly 8. The prescribed scan may then be performed on the subject with the polarizing magnetic field $B_0$ custom trimmed for the subject.

Figure 5:
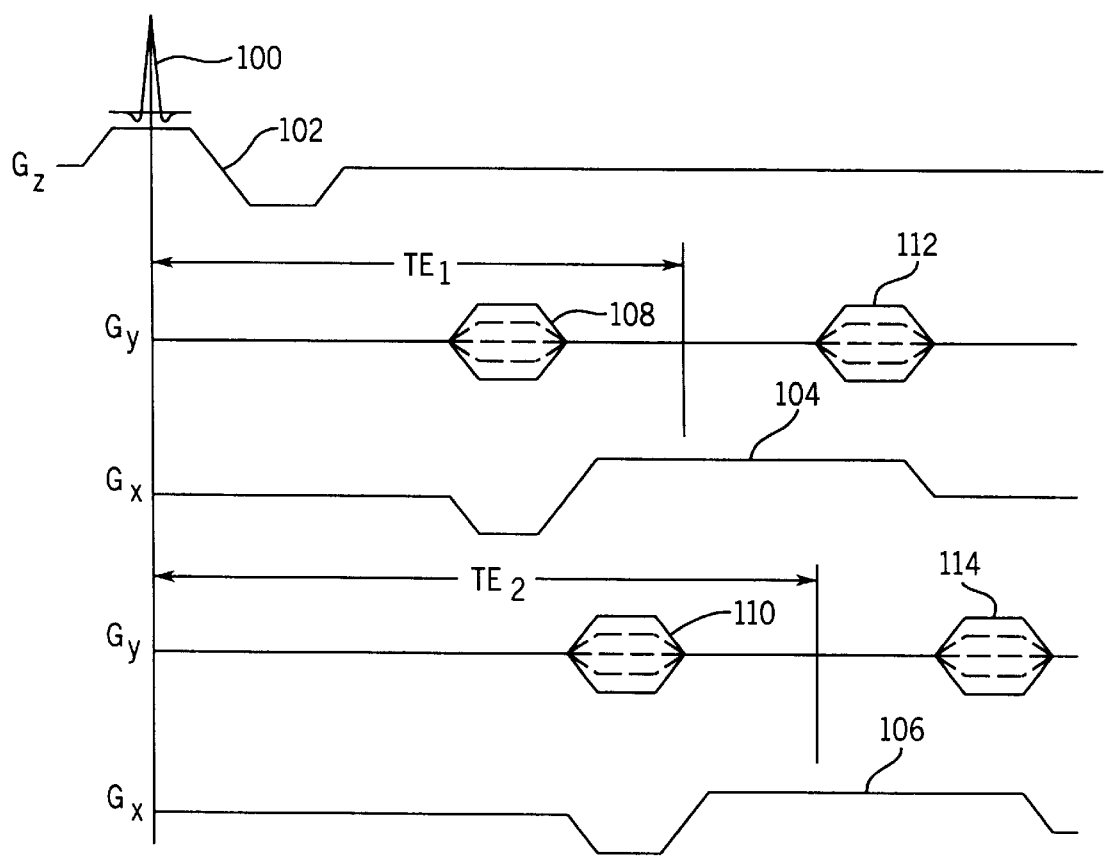
FIG. 5 is a graphic representation of a pulse sequence employed by the NMR system of FIG. 1 to practice the preferred embodiment of the invention.

Referring particularly to FIG. 5, the pulse sequence used in the MRI system to acquire the susceptibility measurements is a multiplanar gradient recalled echo (MPGR) sequence in which two multislice, k-space data sets are acquired. A selective RF excitation pulse 100 having a flip angel of 90° is produced in the presence of a $G_z$ slice select gradient 102, and an NMR signal is acquired at echo time $TE_1$ or $TE_2$ during a $G_x$ readout gradient 104 or 106. The acquired NMR signals are phase encoded by $G_y$ phase encoding gradient pulses 108 or 110 which are stepped in value from $k_y=-16$ to $k_y=+16$. Rewinder gradient pulses 112 or 114 reset the phase of any residual magnetization at the end of the pulse sequence. The NMR data is acquired at a bandwidth of±16 kHz, at a resolution of 32×32 with a field of view of 20 cm.

Special care is taken to make the sequence insensitive to eddy currents produced by magnetic field gradients. It was found that a delay of at least 5 ms between the slice select gradient 102 and the phase encoding gradients 108 or 110 avoided systematic errors in the shim value computations. In the preferred embodiment $TE_1$ is set to 15 ms and $TE_2$ is set to 16 ms. No $G_z$ crusher gradients were used to avoid producing eddy currents that would corrupt the following sequence. The transmit repeat time (TR) is set to 900 ms, during which time one phase encoded NMR signal is acquired from each of 29 separate slices. All 32 phase encodings are acquired at $TE_1$ to produce a first k-space data set for each slice, and the acquisition is repeated at $TE_2$ to produce a second k-space data set for each slice.

Figure 6:
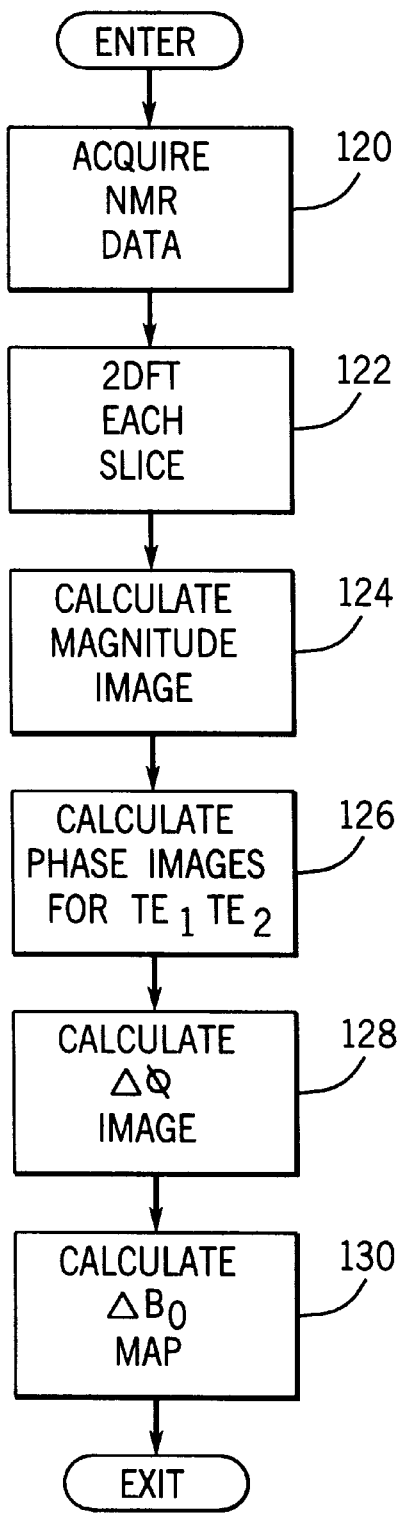
FIG. 6 is a flow chart illustrating the acquisition of a $\Delta B_0$ map using the pulse sequence of FIG. 5.

The acquired data sets are processed to produce two 3D image data sets. One image data set indicates the signal intensity over a 20×20×18 cm volume and the second image data set indicates the phase change that occurs during the 1 ms time difference between $TE_1$ and $TE_2$. Referring particularly to FIG. 6, after the acquisition of the NMR data at process block 120 as described above, the k-space data sets are Fourier transformed along the $k_x$ and $k_y$ axes as indicated at process block 122. This is a conventional complex 2DFT used to reconstruct two-dimensional images and the result is two sets of 29 two-dimensional, 32×32 element images. Each element of these images is a complex number comprised of I and Q components. As indicated at process block 124, a magnitude image is produced next by calculating the magnitude of each element in the complex images:

$$M_{x,y} = \sqrt{I_{x,y}^2 + Q_{x,y}^2} \quad (1)$$

A single 29×32×32 element magnitude image is produced by averaging the magnitudes of corresponding elements in the 29 $TE_1$ and $TE_2$ images. As will be explained below, this magnitude image is employed in the curve fitting process to exclude from consideration regions where the NMR signal magnitude is low and noise is likely to corrupt the measured phase change.

As indicated at process block 126, the next step is to produce phase images by calculating the phase of each image element:

$$\phi_{x,y} = \tan^{-1}(I_{x,y}/Q^{x,y}). \quad (2)$$

A 29×32×32 element $TE_1$ phase image and a 29×32×32 element $TE_2$ phase image are thus produced from the 29 slice images. A phase difference image is then produced at process block 128 by subtracting the phase values in the $TE_1$ phase image from corresponding phase values in the $TE_2$ phase image:

$$\Delta\phi_{x,y,z} = \phi_{x,y,z}^{TE_1} - \phi_{x,y,z}^{TE_2} \quad (3)$$

As indicated at process block 130, a $\Delta B_0$ map is produced from this phase difference image:

$$\Delta B_{0_{x,y,z}} = \Delta\phi_{x,y,z}/\gamma\Delta t, \quad (4)$$

where $\gamma$ is the magnetogyric constant at the nominal polarizing magnetic field strength (i.e., 3 Tesla in the preferred embodiment), and $\Delta t$ is the difference in echo times $TE_1$ and $TE_2$ used in the measurement (i.e., 1 ms in the preferred embodiment).

As a result of the measurement process described above, two images are produced. One image is a magnitude image which indicates the NMR signal strength from each (6.25 mm×6.25 mm×6.25 mm) voxel in a 20 cm×20 cm×18 cm volume which includes the region of interest to be image (e.g., the subject's brain). The second image indicates the change in the polarizing magnetic field ($\Delta B_0$) at each of the same voxels. These two images are used to calculate the ferroshim inserts 72 that are to be attached to the shim assembly 32 and which will minimize the changes in polarizing magnetic field that occur throughout this volume.

Figure 7:
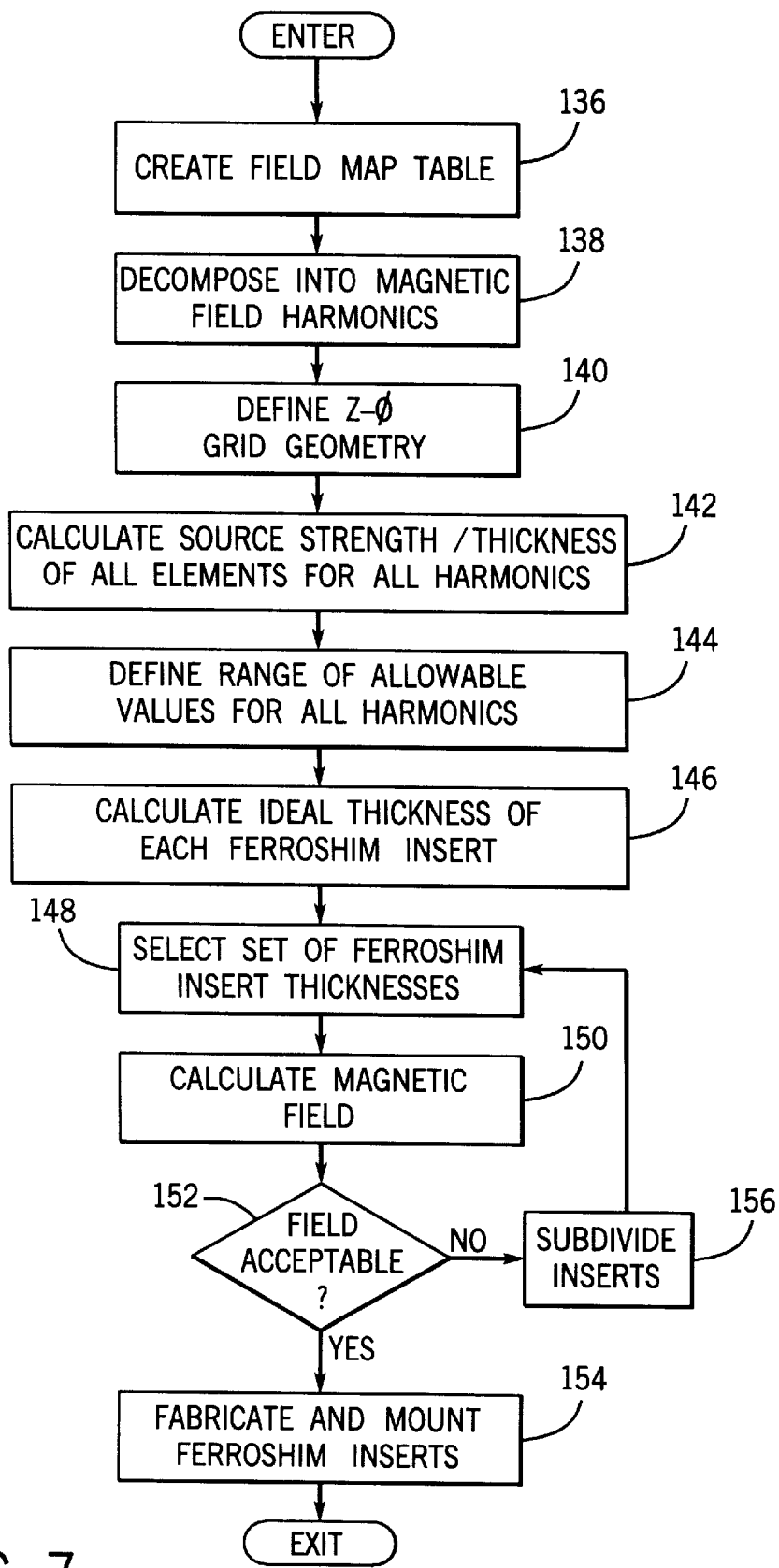
FIG. 7 is a flow chart illustrating the production of ferroshim insert matrix from the $\Delta B_0$ map.

Referring particularly to FIG. 7, the first step as indicated by process block 136 is to assemble the magnetic field data contained in the two images into a field map data table. Each line of this table contains the following information:

coordinates of center of voxel magnetic field change $\Delta B_0$ at voxel signal intensity at voxel.

The signal intensity is derived by normalizing the signal magnitudes in the image, with unity being the intensity of the voxel having maximum signal magnitude. The resulting intensity values are compared with a preset minimum, and entries with low intensity values are discarded. Such entries correspond to regions with low signal to noise ratios which typically come from the volumes of the head which are of no interest, such as the skull. Wherever they come from they should be eliminated since the field strength derived from them is unreliable. Good results have been obtained by retaining data with intensities in excess of 0.1. The resulting table constitutes a field map.

The principle of ferromagnetic shimming is to arrange a distribution of ferromagnetic elements in such a way that the magnetic field that they produce is of a form such that over the region of interest it is substantially equal in magnitude and opposite in sign to that of the field whose homogeneity is to be improved. Thus the summation of the two fields result in a field whose magnitude excursions are substantially smaller, i.e., the magnetic field is more homogeneous. The objective is to calculate a suitable quantity of ferromagnetic material to be appropriately distributed around the region whose magnetic field homogeneity is to be improved. As will be described in more detail below, in the preferred embodiment of the invention, the magnetic field indicated by the field map is decomposed into components. These components are then nulled by calculating an array of ferromagnetic elements that produce equivalent field components that are substantially equal in magnitude and opposite in sign to the decomposed field map components. This method gives control over the whole region of interest and allows the resultant field to be calculated not just at the points that were mapped but at any point in the region of interest.

Magnetic fields may be represented in terms of an infinite series of orthogonal functions known as spherical harmonics. Each harmonic consists of the product of a field term and a source term. The field term determines the spatial variation of that harmonic and the source term defined its strength. The field term consists of the product of an Associated Legendre Function and a Circular Function. A description of the mathematical basis for spherical harmonics and Associated Legendre Functions can be found, for example, in W. R. Smythe, "Static and Dynamic Electricity," McGraw-Hill, 1968. A computer program for calculating Associated Legendre Functions can be found, for example, in W. H. Press, et al., "Numerical Recipes, the Art of Scientific Computing," Cambridge University Press, 1986.

As indicated in FIG. 7 by process block 138, the next step in the process, therefore, is to decompose the field map into a set of these orthogonal components which are commonly referred to as field harmonics, thereby characterizing the type and strength of the magnetic field inhomogeneities. The decomposition consists of performing a multi-parameter least squares fit to determine the best-fit source term for each harmonic field term from the field map data. The field map data is subjected to a statistical analysis known as multiple linear regression, using the spherical harmonic field terms as basis functions. The intensity value associated with each data point in the field map is included in the model as a statistical weight to provide greater emphasis on data points whose magnetic field values are better known. This analysis provides estimates of the strength of every field harmonic included in the statistical model together with an associated error estimate.

Having determined the strength of the various field harmonics characterizing the magnetic field inhomogeneities it remains to design an array of ferromagnetic elements which will generate corresponding harmonics with strength and sign appropriate to substantially cancel the inhomogeneities without at the same time introducing inhomogeneities of a form that were not originally present. In the preferred embodiment the field map is decomposed into 49 spherical harmonics (i.e., up to $6^{th}$ order).

As indicated by process block 140, the next step is to define a grid of elements corresponding to locations in the shim assembly 32. This grid has $N_z$ elements in the axial direction and $N_\phi$ elements in the azimuthal direction, for a total of $N_{el} = N_z * N_\phi$ ferroshim elements. There should be sufficient numbers axially and azimuthally to accommodate the degrees of freedom demanded by the symmetries of the spherical harmonics that are to be substantially nulled or controlled and also to satisfy the requirements of linear programming, i.e. $N_{el}$>Ncon, where Ncon is the number of constraint inequalities. Grids which result in solutions where a substantial fraction of the grid elements contain finite thicknesses of ferromagnetic material, are to be preferred since under such circumstances element areas are maximized and thicknesses are consequentially minimized. The choice of a matrix of $N_z=30$ and $N_\phi=24$ was convenient for the application described herein. The axial length of the array is a matter of experimentation. Arrays which are too long will result in unoccupied elements at the ends of the array; arrays should be made progressively shorter until locations near the ends become filled.

Once the grid has been defined and the linear dimension of each ferroshim element has been chosen, the field strength per unit thickness for every spherical harmonic in the model at every grid location is calculated as indicated at process block 142.

Figure 9A:
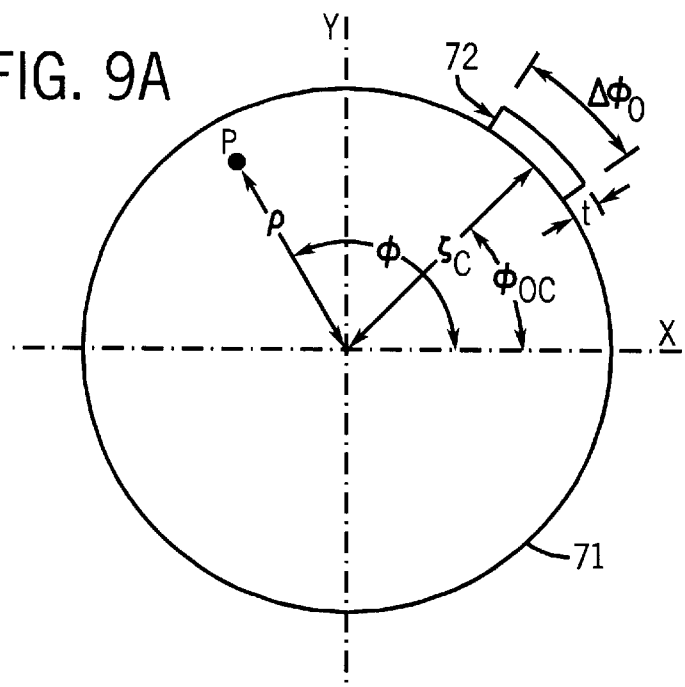
FIGS. 9A and 9B are pictorial representations of a ferroshim insert illustrating parameters employed in the calculations of FIG. 7.
Figure 9B:
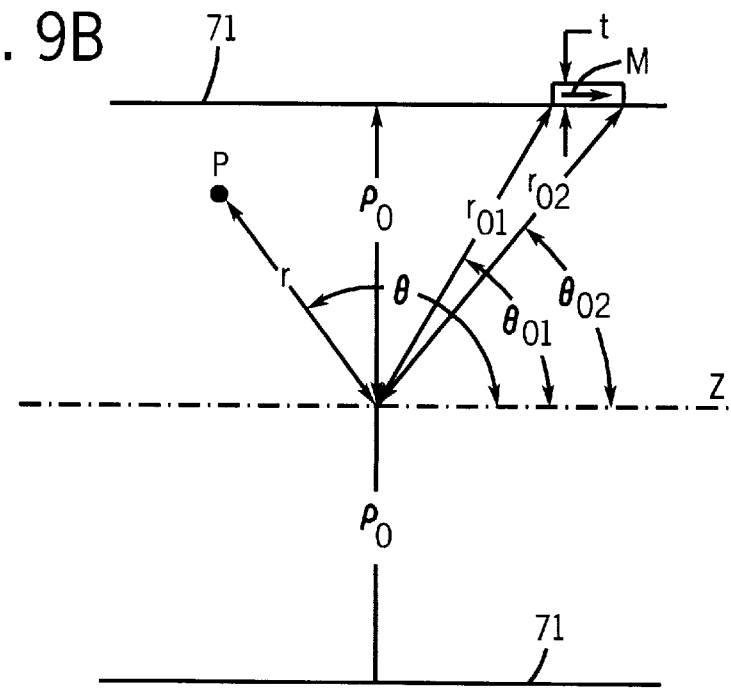

For ferroshim elements where the ratio of the element thickness, t, to the cylindrical mounting radius, $\rho_0$, approaches zero, the axial, z, component of magnetic field, Bz, is given by:

$$Bz = \sum_{m=0}^{\infty} \sum_{n=m+1}^{\infty} (A_n^m \cos m\phi + B_n^m \sin m\phi) r^{n-1} (n+m) P_{n-1}^m(u),$$

where the source coefficients, $A_n^m$ and $B_n^m$ are given by:

$$A_n^m = -t\rho_0 \mu_0 M \sum_{i=1}^{2} (-1)^i \frac{(n-m)! P_n^m(u_{0i}) \Delta\phi_0}{(n+m)! r_{0i}^{n+1}} \frac{\Delta\phi_0}{4\pi} \text{ for } m = 0$$

$$A_n^m = -t\rho_0 \mu_0 M \sum_{i=1}^{2} (-1)^i \frac{(n-m)! P_n^m(u_{0i}) \Delta\phi_0}{(n+m)! r_{0i}^{n+1}}$$

$$\frac{\sin(m\Delta\phi_0/2)\cos m\phi_{0c}}{m\pi} \text{ for } m > 0$$

$$B_n^m = 0 \text{ for } m = 0$$

$$B_n^m = -t\rho_0 \mu_0 M \sum_{i=1}^{2} (-1)^i \frac{(n-m)! P_n^m(u_{0i}) \Delta\phi_0}{(n+m)! r_{0i}^{n+1}}$$

$$\frac{\sin(m\Delta\phi_0/2)\sin m\phi_{0c}}{m\pi} \text{ for } m > 0$$

where, as illustrated in FIGS. 9A and 9B:
t=the radial thickness of the ferroshim 72.
$\rho_0$=radius of the circular cylindrical surface 71 on which ferroshims 72 are mounted.
$\mu_0 = 4\pi 10^{-7}$, the permeability of free space.
M=the axial magnetization of the ferroshim material in the ambient magnetic field.
r=the polar radius of the field point $\rho$.
$u = \cos\theta$, where $\theta$=the polar angle of the field point $\rho$.
$\phi$=the azimuthal angle of the field point $\rho$.
$r_{0i}$=the polar radius of the i'th axial edge of the ferroshim element.
$u_{0i} = \cos\theta_{0i}$, where $\theta_{0i}$=the polar angle of the i'th axial edge of the ferroshim element.
i=1 corresponds to the axial edge with the least positive axial coordinate.
i=2 corresponds to the axial edge with the most positive axial coordinate.
$\phi_{0c}$=the azimuthal angle of the center of the ferroshim element.
$\Delta\phi_0$=the azimuthal angle subtended by the ferroshim element.
$P_n^m(x)$=an Associated Legendre Function of the order m and the degree n.

The above formulae are valid when the physical dimensions are expressed in SI units.

Even if the elements are not bent to conform to the cylindrical surface and even though the elements in the solution to the linear programming problem have finite thickness, the resulting calculated thickness will be substantially correct in practical situations.

The constraints on the strengths of the spherical harmonics in the shimmed map are then defined as indicated at process block 144. It is convenient to set the tolerances on the source strength of each harmonic in such a way that the maximum value of its field at any point on the surface of the volume of interest is substantially less than the desired maximum field resulting from the superposition of the field due to ferroshims and the original inhomogeneous field. An exception to this occurs when a number of electrical shims, typically corresponding to low order harmonics, is available in the MRI system. Then, the tolerances should be loosened on these harmonics to the extent that the resultant harmonic strengths remain within the correction capabilities of the MRI system electrical shims. In the preferred embodiment there were 14 such harmonics. Note also that the constant field term corresponding to the spherical harmonic m=0, n−1=0, should not be part of the linear programming model. The form of spherical harmonics can be found in the above-cited book by Smythe, and methods for finding the extreme of functions and computer programs for implementing them are listed in the above-cited book by W. H. Press, et al.

The numbers of available elements axially and azimuthally, the overall axial length of the array, the strength per unit thickness of all spherical harmonics in the model at every grid element location, and the maximum and minimum allowable strength of every spherical harmonic in the shimmed map, comprise the input for the linear programming process to follow.

As indicated at process block 146 a linear programming method is employed to calculate the ideal thickness of ferroshim inserts 72 at each grid location. The preferred design method involves the use of linear programming techniques such as that described by Dorri et al in U.S. Pat. No. 5,045,794. However, the constraints, instead of being applied to magnetic fields measured at the points as described therein, are applied to the magnitudes of the various harmonic source terms that must be nulled so as to reduce the total field variations throughout the region of interest and also to other, generally higher order terms, that must be controlled to avoid introducing field inhomogeneity components that were not present in the original field map.

The linear programming problem should be set up as follows.

Objective Function $$\text{Minimize: } \sum_{i=1}^{Nel} a(i) t(i)$$

where:

a(i)=the surface area of the i'th ferroshim element.
t(i)=the thickness of the i'th ferroshim element.
Nel=the number of elements in the gnd.

Constraints $$\sum_{i=1}^{Nel} \hat{A}_{Fe_n^m}(i,j)t(i) + A_{Map_n^m}(j) \geq A_{min_n^m}(j) \text{ for } j=1, Nhrm$$

$$\sum_{i=1}^{Nel} \hat{B}_{Fe_n^m}(i,j)t(i) + B_{Map_n^m}(j) \geq B_{min_n^m}(j) \text{ for } j=1, Nhrm$$

$$\sum_{i=1}^{Nel} \hat{A}_{Fe_n^m}(i,j)t(i) + A_{Map_n^m}(j) \leq A_{max_n^m}(j) \text{ for } j=1, Nhrm$$

$$\sum_{i=1}^{Nel} \hat{B}_{Fe_n^m}(i,j)t(i) + B_{Map_n^m}(j) \leq B_{max_n^m}(j) \text{ for } j=1, Nhrm$$

$t(i) \leq t_{max}$ for $i=1,Nel$ $t(i) \geq 0$ for $i=1,Nel$ where:

$t(i)$=the thickness of the i'th ferroshim element.

$t_{max}$=the maximum allowable thickness of any element.

Nhrm=the number of harmonics in the model.

$\hat{A}_{Fe_n}^m(i,j), \hat{B}_{Fe_n}^m(i,j)$=the source strength per unit thickness of the i'th element and the j'th harmonic.

$A_{Map_n}^m(j)$, $B_{Map_n}^m(j)$=the source strength of the j'th harmonic.

$A_{max_n}^m(j)$, $B_{max_n}^m(j)$=the maximum allowable source strength of the j'th harmonic in the shimmed map.

$A_{min_n}^m(j)$, $B_{min_n}^m(j)$=the minimum allowable source strength of the j'th harmonic in the shimmed map.

A description for setting up this linear programming solution and exemplary computer code for implementing it is described in the above cited W. H. Press et al book which is incorporated herein by reference.

Referring still to FIG. 7, since the linear programming process produces ideal ferroshim insert thicknesses at each grid location and ferroshim materials are commercially available in finite thicknesses, a set of practical ferroshim inserts are selected at process block 148. The resulting magnetic field produced using the selected ferroshim inserts is calculated at process block 150 by combining the original measured field map with the field produced by the ferroshim inserts. The resulting combined field map is examined at decision block 152, and if the extreme fields are within acceptable limits, the selected ferroshim inserts are used to fabricate the shim assembly 32 as indicated at 154. Otherwise, the available ferroshim inserts are subdivided along their linear z and/or φ direction at process block 156 to more closely approximate the ideal values calculated at process block 146. The process at block 150 is repeated until acceptable field variations are determined at decision block 152. The resulting ferroshim inserts are bonded to the surface of assembly 32 at their grid locations.

While the current preferred embodiment of the invention employs a shim assembly comprised of discrete pieces of ferroshim material bonded to a sheet of Mylar foil 70, it is contemplated that ferroshim material may also be printed on the Mylar foil 70 at the required thickness. A ferromagnetic ink is used and it is printed on the foil 70 at the exact thickness calculated in process block 146. This will enable the susceptibility measurements made at the site of the MRI system to be sent via the Internet or the like to a remote computing center where the array of ferroshim inserts are calculated. This result is sent back to the site of the MRI system where it is printed out on a sheet of Mylar for insertion in the local coil assembly 8.

In an alternative embodiment to the above method of calculating the weight of the ferroshim inserts, the corrective field produced by each ferroshim insert is designed to offset the change in field measured at its location on the 24×30 element grid without regard to the field produced at any other locations in the region of interest. A practical implementation of this method is described in U.S. Pat. No. 5,045,794 issued in 1991 and in B. Dorri, et al, "Passive Shimming of MR Magnets: Algorithm, Hardware and Results," IEEE Trans., Applied Superconductivity, 3(1)3133 (1993), which are incorporated herein by reference. This alternative method involves measurement of the influence of each ferroshim insert in the 24×30 element grid, followed by the use of a linear programming algorithm to determine the quantity of ferromagnetic material that should be located at each location in the shim assembly 32.

In the preferred embodiment of the invention described above the local coil assembly 8 is completely, passively shimmed for each particular subject. That is, the measurement of $B_0$ field homogeneity is made with a shim assembly 32 containing no ferroshim inserts 72. Alternative embodiments of the invention are possible.

In a first alternative embodiment a set of initial shim assemblies 32 are provided which contain ferroshim inserts 72 that shim for specific subject characteristics. Such initial shim assemblies 32 are developed by carrying out the procedure described above on a large number of subjects, and identifying groups of subjects having similar ferroshim inserts 72. Initial shim assemblies 32 are formed by using the ferroshim inserts 72 which are common to each member of the group. Therefore, when used with a particular patient who can be associated with one of the groups, the selected initial shim assembly 32 for that group is used. It contains ferroshim inserts 72 which roughly correct the $B_0$ field and the above procedure is performed to determine what further ferroshim inserts 72 should be added to the shim assembly 32 to completely correct the $B_0$ field for a particular patient. This reduces the number of ferroshim inserts 72 that must be attached after measuring a subject prior to imaging.

Figure 8:
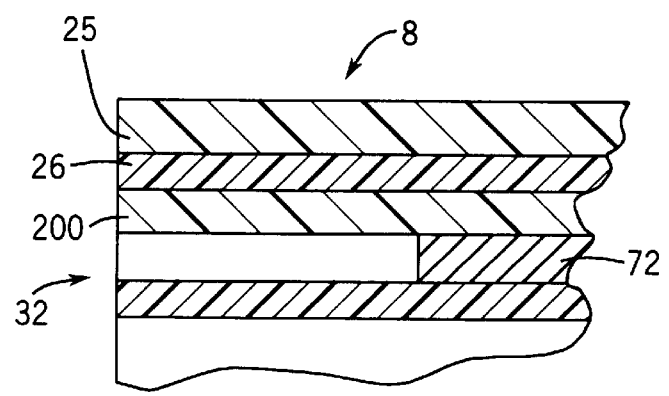
FIG. 8 is a partial view in cross-section of an alternative embodiment of the local coil in FIG. 2.

Another alternative embodiment of the invention employs a combination of passive shimming using ferroshim inserts 72 and active shimming using local shim coils in the local coil assembly 8. Referring particularly to FIG. 8, the local coil assembly 8 is modified to include a shim coil assembly 200 disposed between the passive shim assembly 32 and the shield assembly 26. The shim coil assembly 200 is a circular cylindrical structure comprised of an insulating substrate which supports shim coils that are formed as printed circuits. The number of shim coils and their particular pattern on the substrate depends on the number and type of harmonics to be corrected. Each set of shim coils in the shim coil assembly 200 is connected to a separate power supply (not shown) which produces a controlled current that generates the desired corrective magnetic field.

The passive shim assembly 32 in this second alternative embodiment is similar to that in the first alternative embodiment described above. It contains ferroshim inserts 72 that correct the $B_0$ field for inhomogeneity caused by specific anatomic characteristics. Measurements are made with the appropriate passive shim assembly 32 in place using the pulse sequence of FIG. 5 as described above. Instead of calculating the location and thickness of ferroshim inserts 72, the measured changes in the polarizing field ($\Delta B_0$ map) are used to calculate the currents applied to the shim coils in the shim coil assembly 200. This "hybrid" shim embodiment enables the number of shim coils and associated power supplies to be substantially reduced in number. It also enables the local coil assembly 8 to be shimmed to a particular subject by adjusting current levels in the shim coils, thus avoiding the need to construct a specific passive shim assembly 32 for each subject.

While the preferred embodiment of the invention pertains to the imaging of the human brain, it should be apparent to those skilled in the art that the invention is applicable to the imaging of other subjects in humans and other animals.

What is claimed is:

1. A method for acquiring a prescribed magnetic resonance image of a region of interest in a subject using a local coil, the steps comprising:

a) positioning the local coil in a preestablished location relative to the region of interest;

b) acquiring NMR measurement data from the region of interest by performing a pulse sequence with a magnetic resonance imaging (MRI) system that receives NMR signals from the local coil;

c) reconstructing a phase image using the acquired NMR measurement data which indicates changes in polarizing magnetic field produced by the MRI system throughout the region of interest;

d) calculating a ferroshim insert matrix from the phase image which indicates the location in a passive shim assembly for placement of passive shim material that will reduce changes in the polarizing magnetic field throughout the region of interest;

e) attaching the passive shim assembly to the local coil;

f) positioning the local coil in the preestablished location relative to the region of interest; and g) acquiring the prescribed magnetic resonance image by performing a prescribed pulse sequence with the MRI system and receiving NMR signals from the local coil.

2. The method as recited in claim 1 in which step b) includes acquiring a first NMR measurement data set with a pulse sequence in which the NMR signal is acquired at a first echo time ($TE_1$), and acquiring a second NMR measurement data set with a pulse sequence in which the NMR signal is acquired at a second echo time ($TE_2$); and in which step c) includes reconstructing first and second phase images from the respective first and second NMR measurement data sets, and calculating the phase difference at corresponding locations in the first and second phase images.

3. The method as recited in claim 2 in which step d) includes calculating the change in polarizing magnetic field using the phase image and the time difference between the first and second echo times.

4. The method as recited in claim 1 in which step e) includes attaching ferroshim inserts to a foil in a pattern determined by information in the ferroshim insert matrix.

5. The method as recited in claim 4 in which the local coil is circular cylindrical in shape and step e) is performed by forming the passive shim assembly into a circular cylindrical sleeve, and inserting the passive shim assembly into the local coil.

6. The method as recited in claim 1 in which the passive shim assembly is selected from a set of passive shim assemblies which each contain ferroshim inserts positioned to reduce polarizing magnetic field inhomogeneity when used with a subject having particular anatomic characteristics, the selected passive shim assembly is attached to the local coil during step b), and step d) includes attaching further ferroshim inserts to the selected passive shim assembly.

7. The method as recited in claim 1 in which step e) includes printing ferroshim inserts with an ink on a foil in a pattern and at a thickness determined by information in the ferroshim insert matrix.

8. The method as recited in claim 1 in which step d) includes:

i) producing a field map from the phase image which indicates changes in the polarizing magnetic field in a surface which surrounds the region of interest; and ii) calculating the amounts of ferroshim material at an array of locations on said surface which will substantially offset the measured changes in polarizing magnetic field.

9. The method as recited in claim 8 in which step ii) includes decomposing the field map into magnetic field harmonics and calculating the effect of ferroshim material at each array location on each magnetic field harmonic.

10. The method as recited in claim 9 in which step ii) further includes using a linear programming method to calculate the amount of ferroshim material at each array location.

* * * * *

UNITED STATES PATENT AND TRADEMARK OFFICE
CERTIFICATE OF CORRECTION

PATENT NO.     : 6,294,972 B1
DATED          : September 25, 2001
INVENTOR(S)    : Jesmanowicz et al.

It is certified that error appears in the above-identified patent and that said Letters Patent is hereby corrected as shown below:

<u>Column 1,</u>
Line 7, insert the following:
-- STATEMENT REGARDING FEDERALLY SPONSORED RESEARCH OR DEVELOPMENT
The U.S. government has a paid-up license in this invention and the right in limited circumstances to require the patent owner to license others on reasonable terms as provided for by the terms of contract No. CA41464 awarded by the National Cancer Institute of the National Institutes of Health. --

Signed and Sealed this

Thirtieth Day of September, 2003

JAMES E. ROGAN
*Director of the United States Patent and Trademark Office*